(12) United States Patent
Kang et al.

(10) Patent No.: US 9,919,553 B2
(45) Date of Patent: Mar. 20, 2018

(54) EMBOSSING TOOL AND METHODS OF PREPARATION

(71) Applicant: E Ink California, LLC, Fremont, CA (US)

(72) Inventors: Yih-Ming Kang, Fremont, CA (US); Du Quy Le, San Jose, CA (US); Hanan Liu, Milpitas, CA (US); Yu Li, Fremont, CA (US); Donald A. Schultz, San Jose, CA (US)

(73) Assignee: E INK CALIFORNIA, LLC, Fremont, CA (US)

(*) Notice: Subject to any disclaimer, the term of this patent is extended or adjusted under 35 U.S.C. 154(b) by 0 days.

(21) Appl. No.: 14/841,560

(22) Filed: Aug. 31, 2015

(65) Prior Publication Data
US 2016/0059617 A1 Mar. 3, 2016

Related U.S. Application Data

(63) Continuation-in-part of application No. 14/475,220, filed on Sep. 2, 2014, now abandoned.

(51) Int. Cl.
| | |
|---|---|
| *G02B 26/08* | (2006.01) |
| *G02F 1/29* | (2006.01) |
| *B44B 5/02* | (2006.01) |
| *G03F 7/00* | (2006.01) |

(52) U.S. Cl.
CPC ............ *B44B 5/026* (2013.01); *G03F 7/0002* (2013.01)

(58) Field of Classification Search
CPC ......... G02F 1/133555; G02F 1/134363; G02F 1/1368; G02F 2001/136231; B01L 2200/12; B01L 2200/14; B01L 2300/0816; B01L 2300/0887; B01L 2300/1805; B01L 2300/1894; B01L 2400/0406; B01L 7/52
USPC .......................................... 359/237, 290–298
See application file for complete search history.

(56) References Cited

U.S. PATENT DOCUMENTS

| | | | |
|---|---|---|---|
| 3,079,251 A | 2/1963 | Donnelly et al. | |
| 6,503,421 B1 | 1/2003 | Wang | |
| 6,930,818 B1 | 8/2005 | Liang et al. | |
| 7,206,119 B2 | 4/2007 | Honeyman et al. | |
| 7,359,120 B1 * | 4/2008 | Raymond | G02B 27/2214 359/619 |
| 7,442,029 B2 | 10/2008 | Lof | |
| 7,470,386 B2 | 12/2008 | Kang et al. | |

(Continued)

FOREIGN PATENT DOCUMENTS

| | | |
|---|---|---|
| CN | 202640993 | 1/2013 |
| CN | 103576448 A | 2/2014 |

(Continued)

OTHER PUBLICATIONS

U.S. Appl. No. 14/475,220, filed Sep. 2, 2014, Kang et al.

(Continued)

*Primary Examiner* — Brandi Thomas
(74) *Attorney, Agent, or Firm* — Antranig Baronian

(57) ABSTRACT

The present invention is directed to an embossing tool having a microstructure on its surface wherein the surface of the embossing tool has a thin layer of gold or an alloy thereof. Such an embossing tool not only can reduce adhesion between the surface of the embossing tool and a cured material, but also does not cause any significant change to the profile of the microstructure.

14 Claims, 6 Drawing Sheets

(56) References Cited

U.S. PATENT DOCUMENTS

| | | | |
|---|---|---|---|
| 7,880,958 | B2 | 2/2011 | Zang et al. |
| 8,077,141 | B2 | 12/2011 | Duthaler et al. |
| 8,114,262 | B2 | 2/2012 | Kang et al. |
| 9,121,979 | B2 | 9/2015 | Bita et al. |
| 2001/0047880 | A1* | 12/2001 | Abbott ............... H01L 23/4985 174/254 |
| 2007/0119048 | A1* | 5/2007 | Li ......................... B82Y 30/00 29/623.5 |
| 2008/0165122 | A1* | 7/2008 | Duthaler ............... G02F 1/1362 345/107 |
| 2009/0311629 | A1 | 12/2009 | Lee et al. |
| 2010/0302616 | A1* | 12/2010 | Bita ..................... G02B 6/0036 359/291 |
| 2012/0126458 | A1 | 5/2012 | King |

FOREIGN PATENT DOCUMENTS

| | | |
|---|---|---|
| JP | S62226178 | 10/1987 |
| JP | H04143790 | 5/1992 |
| TW | 200724723 A | 7/2007 |
| TW | I447781 | 8/2014 |
| WO | WO 01/067170 | 9/2001 |
| WO | 2013015648 A2 | 1/2013 |

OTHER PUBLICATIONS

Sprague, R.A. (Sep. 23, 2009) SiPix Microcup Electrophoretic Epaper for Ebooks. *NIP* 25, 2009 pp. 460-462. (Presentation conducted on Sep. 23, 2009 at the 25th Int'l Conference on Digital Printing Technologies, Digital Fabrication 2009 (NIP 25) by Society.

Zang, H.M., Wang, F., Kang, Y.M., Chen, Y. and Lin, W. (Jul. 2007) *Microcup® e-Paper for Embedded and Flexible Designs*. IDMC'07, Taipei International Convention Center, Taiwan.

Zang, H.M. (Feb. 2007) *Developments in Microcup® Flexible Displays*. Presentation conducted at the 6th Annual Flexible Display and Microelectronics Conference, Phoenix, AZ Feb. 6-8.

Ho, Andrew. (Nov. 2006) *Embedding e-Paper in Smart Cards, Pricing Labels & Indicators*. Presentation conducted at Smart Paper Conference Nov. 15-16, 2006, Atlanta, GA, USA.

Zang, H.M. (Sep. 2006) *Monochrome and Area Color Microcup®EPDs by Roll-to-Roll Manufacturing Process*. Presentation conducted at the Fourth Organic Electronics Conference and Exhibition (OEC-06), Sep. 25-27, 2006, Frankfurt, Germany.

Wang, X., Zang, H.M. and Li, P. (Jun. 2006) Roll-to-Roll Manufacturing Process for Full Color Electrophoretic film. *SID Digest*, 00pp. 1587-1589.

Zang, H.M., Wang, W., Sun, C., Gu, H., and Chen, Y. (May 2006) Monochrome and Area Color Microcup® EPDs by Roll-to-Roll Manufacturing Processes. *ICIS' 06 International Congress of Imaging Science Final Program and Proceedings*, pp. 362-365.

Wang, X., Li, P., Sodhi, D., Xu, T. and Bruner, S. et al., (Feb. 2006) *Inkjet Fabrication of Multi-Color Microcup® Electrophorectic Display*. The Flexible Microelectronics & Displays Conference of U.S. Display Consortium.

Liang, R.C., (Feb. 2005) *Flexible and Roll-able Displays/Electronic Paper—A Brief Technology Overview*. Flexible Display Forum, 2005, Taiwan.

Zang, H.M. & Hou, Jack, (2005, Feb.) *Flexible Microcup® EPD by RTR Process*. Presentation conducted at 2$^{nd}$ Annual Paper-Like Displays Conference, Feb. 9-11, 2005, St. Pete Beach, Florida.

Ho, Candice. (Feb. 1, 2005) *Microcupt® Electronic Paper Device and Application*. Presentation conducted at USDC 4th Annual Flexible Display Conference 2005.

Bardsley, J.N. & Pinnel, M.R. (2004, Nov.) Microcup™ Electrophoretic Displays. *USDC Flexible Display Report*, 3.1.2. pp. 3-12-3-16.

Liang, R.C. (Oct. 2004) *Flexible and Roll-able Displays/Electronic Paper—A Technology Overview*. Paper presented at the METS 2004 Conference in Taipie, Taiwan.

Liang, R.C., Zang, H.M., Wang, X., Chung, J. & Lee, H., (Jun./Jul. 2004) << Format Flexible Microcup® Electronic Paper by Roll-to-Roll Manufacturing Process >>, Presentation conducted at the 14th FPD Manufacturing Technology EXPO & Conference.

Wang, X., Kiluk, S., Chang, C., & Liang, R.C., (Jun. 2004) Microcup® Electronic Paper and the Converting Processes. *Advanced Display*, Issue 43, 48-51 (in Chinese, with English abstract).

Hou, J., Chen, Y., Li, Y., Weng, X., Li, H. and Pereira, C. (May 2004). Reliability and Performance of Flexible Electrophoretic Displays by Roll-to-Roll Manufacturing Processes. *SID Digest*, 32.3, 1066-1069.

Liang, R.C. (Apr. 2004). *Microcup Electronic Paper by Roll-to-Roll Manufacturing Process*. Presentation at the Flexible Displays & Electronics 2004 of Intertech, San Fransisco, California, USA.

Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, I9.6.1.

Wang, X., Kiluk, S., Chang, C., & Liang, R.C. (Feb. 2004). Mirocup® Electronic Paper and the Converting Processes. *ASID*, 10.1.2-26, 396-399, Nanjing, China.

Zang, H.M. (Feb. 2004). *Microcup Electronic Paper*. Presentation conducted at the Displays & Microelectronics Conference of U.S. Display Consortium, Phoenix, Arizona, USA.

Zang, H.M, Hwang, J.J., Gu, H., Hou, J., Weng, X., Chen, Y., et al. (Jan. 2004). Threshold and Grayscale Stability of Microcup® Electronic Paper. *Proceeding of SPIE-IS&T Electronic Imaging, SPIE* vol. 5289, 102-108.

Ho, C., & Liang, R.C. (Dec. 2003). *Microcup ® Electronic Paper by Roll-to-Roll Manufacturing Processes*. Presentation conducted at FEG, Nei-Li, Taiwan.

Chung, J., Hou, J., Wang, W., Chu, L.Y., Yao, W., & Liang, R.C. (Dec. 2003). Microcup® Electrophoretic Displays, Grayscale and Color Rendition. *IDW*, AMD2/EP1-2, 243-246.

Zang, H.M. (Oct. 2003). *Microcup ® Electronic Paper by Roll-to-Roll Manufacturing Processes*. Presentation conducted at the Advisory Board Meeting, Bowling Green State University, Ohio, USA.

Allen, K. (Oct. 2003). Electrophoretics Fulfilled. *Emerging Displays Review: Emerging Display Technologies, Monthly Report—*Oct. 9-14, 2003.

Kleper, M., Miller, P., Miller L. (Oct. 2003) An Investigation of the Emerging and Developing Technologies Related to the Generation Beyond Print-on-Paper. *Advanced Display Technologies*, Oct. 2003, pp. 13-15, Rochester Institute of Technology (R.I.T.).

Zang, H.M., & Liang, R.C. (2003) Microcup Electronic Paper by Roll-to-Roll Manufacturing Processes. *The Spectrum*, 16(2), 16-21.

Chen, S.M. (Jul. 2003) The Applications for the Revolutionary Electronic Paper Technology. *OPTO News & Letters*, 102, 37-41. (in Chinese, English abstract attached).

Lee, H., & Liang, R.C. (Jun. 2003) SiPix Microcup® Electronic Paper—An Introduction. *Advanced Display*, Issue 37, 4-9 (in Chinese, English abstract attached).

Liang, R.C., Hou, J., Chung, J., Wang, X., Pereira, C., & Chen, Y. (May 2003). Microcup® Active and Passive Matrix Electrophoretic Displays by A Roll-to-Roll Manufacturing Processes. *SID Digest*, vol. 34, Issue 1, pp. 838-841, 20.1.

Chen, S.M. (May 2003) The New Application and the Dynamics of Companies. *TRI*. 1-10. (In Chinese, English abstract attached).

Liang, R.C., Hou, J., Zang, H.M., Chung, J., & Tseng, S. (Feb. 2003). Microcup® Displays: Electronic Paper by Roll-to-Roll Manufacturing Processes. *Journal of the SID*, 11(4), 621-628.

Liang, R.C., Hou, J., Zang, H.M., & Chung, J. (Feb. 2003). *Passive Matrix Microcup® Electrophoretic Displays*. Paper presented at the IDMC, Taipei, Taiwan.

Liang, R.C., & Tseng, S. (Feb. 2003). *Microcup® LCD, A New Type of Dispersed LCD by A Roll-to-Roll Manufacturing Process*. Paper presented at the IDMC, Taipei, Taiwan.

Liang, R.C. (Feb. 2003) *Microcup® Electrophoretic and Liquid Crystal Displays by Roll-to-Roll Manufacturing Processes*. Presentation conducted at the Flexible Microelectronics & Displays Conference of U.S. Display Consortium, Phoenix, Arizona.

(56) References Cited

OTHER PUBLICATIONS

Liang, R.C., Hou, J., & Zang, H.M. (Dec. 2002) Microcup Electrophoretic Displays by Roll-to-Roll Manufacturing Processes. *IDW*, EP2-2, 1337-1340.
Nikkei Microdevices. (Dec. 2002) Newly-Developed Color Electronic Paper Promises—Unbeatable Production Efficiency. *Nikkei Microdevices*, p. 3. (in Japanese, with English translation).
U.S. Appl. No. 14/475,220, USPTO Office Action, dated May 20, 2016.
Kimerling, T. E., Liu, E. W., Kim, B. H., "Rapid hot embossing of polymer microfeatures", Microsyst Technol (2006) 12: 730-735. Jan. 1, 2006.
U.S. Appl. No. 14/475,220, USPTO Offical Action, dated Mar. 23, 2017, Mar. 23, 2017.

* cited by examiner

EMBOSSING TOOL AND METHODS OF PREPARATION

This application is continuation-in-part of U.S. application Ser. No. 14/475,220, filed Sep. 2, 2014, which is incorporated herein by reference in its entirety.

FIELD OF THE INVENTION

The invention is directed to an embossing tool and methods for its preparation.

BACKGROUND OF THE INVENTION

Embossing tools usually are made of nickel, copper, an alloy or other types of composite materials. Nickel is the most widely used material for embosser fabrication.

There are a few problems associated with the currently available embossing tools, in particular, incomplete release of the cured material or hot embossed material from the embossing tool, after embossing.

There are ways to modify the surface of an embossing tool to reduce the adhesion between the surface of the embossing tool and the cured or hot embossed material. Such methods may include silane-coating, silicone resin coating, teflon-coating, or nickel-teflon composite plating. Unfortunately, all of them failed to produce satisfactory results.

Silicone resin and teflon can be applied to the surface of the embossing tool via wet-coating. However, after drying and curing, the thickness uniformity of the coating on the surface of microstructure is poor which may change the shape of the resulting microstructures on the embossing tool.

The teflon-coating via physical vapor deposition (PVD) or chemical vapor deposition (CVD) has shown poor throwing-power and also non-uniform coverage when the microstructure on the surface of the embossing tool has a high aspect ratio. In addition, poor durability and mechanical strength of the teflon-coating is another concern, especially if an embossing tool needs to be extensively used for mass production.

Nickel-teflon composite coating can be applied to the surface of the embossing tool via electroplating or an electro-less plating process. However, the minimum coating thickness normally is several microns. Therefore, if an embossing tool has a microstructure with small dimensions, especially narrow trenches, on its surface, such coating may drastically change the profile and aspect ratio of the microstructure, rendering the embossing task much more difficult.

DETAILED DESCRIPTION OF THE INVENTION

Figure 1A:
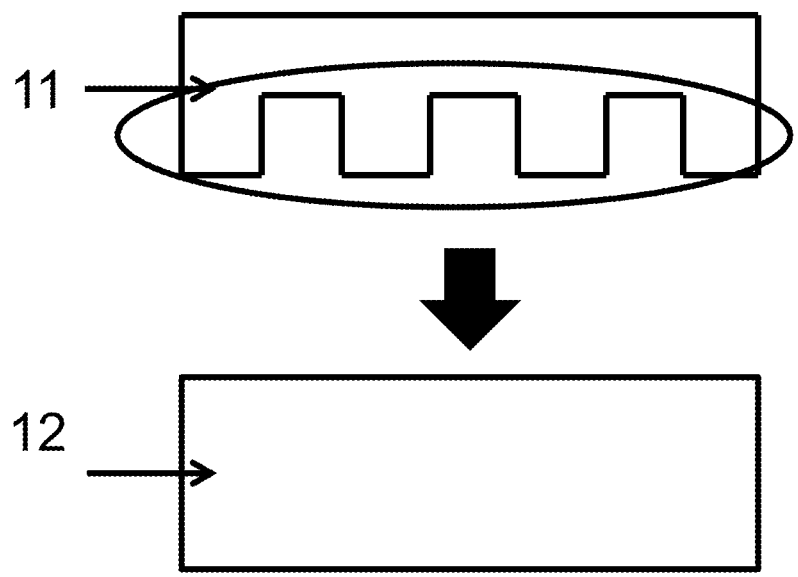
FIGS. 1A and 1B illustrate an embossing process.
Figure 1B:
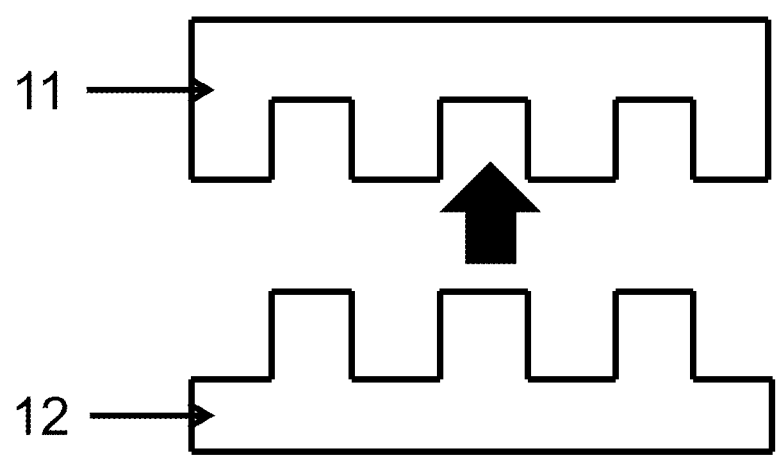

FIGS. 1A and 1B illustrate an embossing process with an embossing tool (11), with a three-dimensional microstructure (circled) on its surface. As shown in FIG. 1, after the embossing tool (11) is applied to a curable embossing composition or hot-embossable material (12), and when the embossing composition is cured (e.g., by radiation) or the hot-embossable material becomes embossed by heat and pressure, the cured or hot embossed material is released from the embossing tool (see FIG. 1B). However, with a conventional embossing tool, the cured or hot embossed material sometimes does not completely release from the tool because of the undesired strong adhesion between cured or hot embossed material and the surface of the embossing tool. In this case, there may be some cured or hot embossed material transferred to, or stuck on, the surface of the embossing tool, leaving an uneven surface on the object formed from the process.

This problem is even more pronounced if the object is formed on a supporting layer, such as a transparent conductive layer or a polymeric layer. If the adhesion between the cured or hot embossed material and the supporting layer is weaker than the adhesion between the cured or hot embossed material and the surface of the embossing tool, the release process of the cured or hot embossed material from the embossing tool may cause separation of the object from the supporting layer.

In some cases, an object may be formed on a stack of layers, and in this case, if the adhesion between any two of the adjacent layers is weaker than the adhesion between the cured or hot embossed material and the surface of the embossing tool, the release process of the cured or hot embossed material from the embossing tool could cause a break-down between the two layers.

The above described problems are especially a concern when the cured embossing composition or hot embossed material does not adhere well to certain supporting layers. For example, if the supporting layer is a polymeric layer, the adhesion between the polymeric layer and a cured or hot embossed embossing composition is weak in case one of them is hydrophilic and the other is hydrophobic. Therefore it is preferred that either both of the embossing composition and the supporting layer are hydrophobic or both are hydrophilic.

As examples, suitable hydrophobic compositions for forming the embossing layer or supporting layer may comprise a thermoplastic, thermoset, or a precursor thereof. Examples of thermoplastic or thermoset precursor may be multifunctional acrylate or methacrylate, multifunctional vinyl ether, multifunctional epoxide and oligomers or polymers thereof.

Suitable hydrophilic compositions for forming the embossing layer or supporting layer may comprise a polar oligomeric or polymeric material. As described in U.S. Pat. No. 7,880,958, such a polar oligomeric or polymeric material may be selected from the group consisting of oligomers or polymers having at least one of the groups such as nitro ($-NO_2$), hydroxyl ($-OH$), carboxyl ($-COO$), alkoxy ($-OR$ wherein R is an alkyl group), halo (e.g., fluoro, chloro, bromo or iodo), cyano ($-CN$), sulfonate ($-SO_3$) and the like. The glass transition temperature of the polar polymer material is preferably below about 100° C. and more preferably below about 60° C. Specific examples of suitable polar oligomeric or polymeric materials may include, but are not limited to, polyvinyl alcohol, polyacrylic acid, poly(2-hydroxylethyl methacrylate), polyhydroxy functionalized polyester acrylates (such as BDE 1025, Bomar Specialties Co, Winsted, Conn.) or alkoxylated acrylates, such as ethoxylated nonyl phenol acrylate (e.g., SR504, Sartomer Company), ethoxylated trimethylolpropane triacrylate (e.g., SR9035, Sartomer Company) or ethoxylated pentaerythritol tetraacrylate (e.g., SR494, from Sartomer Company).

Figure 2:
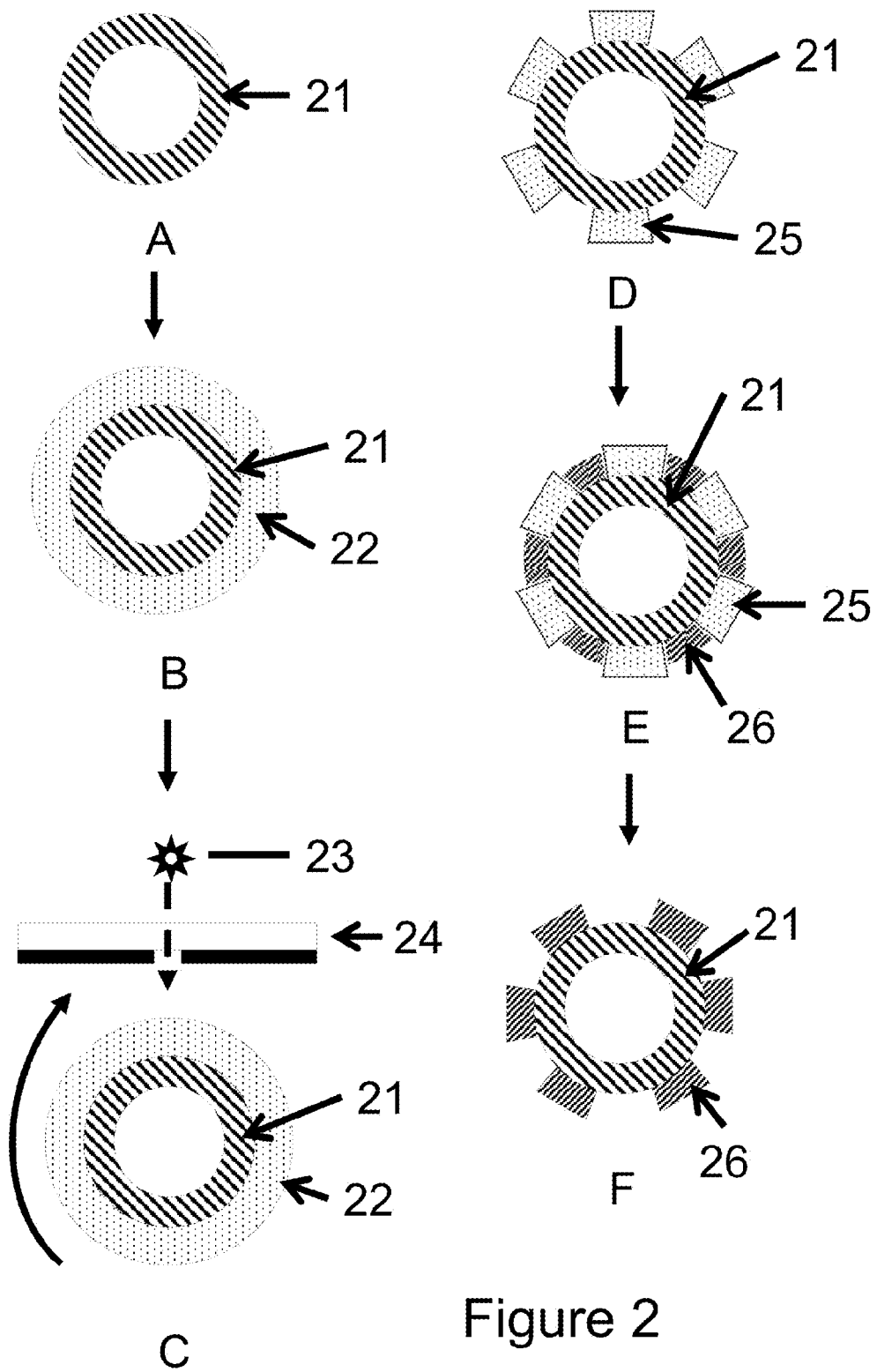
FIG. 2 illustrates a method for forming a microstructure on the surface of an embossing tool.

Method 1:

FIG. 2 illustrates one of conventional methods for forming a microstructure on the surface of an embossing tool.

The term "embossing tool", in the context of the present application, may be an embossing sleeve or an embossing drum. While only the preparation of an embossing sleeve is demonstrated in FIG. 2, it is understood that the method can be used for the preparation of an embossing drum as well. The term "embossing" drum or sleeve refers to drums or sleeves which have a three-dimensional microstructure on its outer surface. The term "embossing drum" is used so as to distinguish it from a plain drum which does not have a three-dimensional microstructure on its outer surface.

The embossing drum may be used directly as an embossing tool. When the embossing sleeve is used for embossing, it is usually mounted on a plain drum to allow rotation of the embossing sleeve.

The embossing drum or sleeve (21) is usually formed of a conductive material, such as a metal (e.g., aluminum, copper, zinc, nickel, chromium, iron, titanium, cobalt or the like), an alloy derived from any of the aforementioned metals, or stainless steel. Different materials may be used to form a drum or sleeve. For example, the center of the drum or sleeve may be formed of stainless steel and a nickel layer is sandwiched between the stainless steel and the outermost layer which may be a copper layer.

Alternatively, the embossing drum or sleeve (21) may be formed of a non-conductive material with a conductive coating or a conductive seed layer on its outer surface.

Before coating a photosensitive material (22) on the outer surface of a drum or sleeve (21), as shown in the step of FIG. 2B, precision grinding and polishing may be used to ensure smoothness of the outer surface of the drum or sleeve.

In the step of FIG. 2B, a photosensitive material (22), e.g., a photoresist, is coated on the outer surface of the drum or sleeve (21). The photosensitive material may be of a positive tone, negative tone or dual tone. The photosensitive material may also be a chemically amplified photoresist. The coating may be carried out using dip, spray or ring coating. After drying and/or baking, the photosensitive material is subjected to exposure, as shown in FIG. 2C, to a light source.

Alternatively, the photosensitive material (22) can be a dry film photoresist (which is usually commercially available) that is laminated onto the outer surface of the drum or sleeve (21). When a dry film is used, it is also exposed to a light source as described below.

In the step of FIG. 2C, a suitable light source (23), e.g., IR, UV, e-beam or laser, is used to expose the photosensitive material coated or a dry film photoresist (22) laminated on the drum or sleeve (21). The light source can be a continuous or pulsed light. A photomask (24) is optionally used to define the three-dimensional microstructure to be formed. Depending on the microstructure, the exposure can be step-by-step, continuous or a combination thereof.

After exposure, the photosensitive material (22) may be subjected to post-exposure treatment, e.g., baking, before development. Depending on the tone of the photosensitive material, either exposed or un-exposed areas will be removed by using a developer. After development, the drum or sleeve with a patterned photosensitive material (25) on its outer surface (as shown in FIG. 2D) may be subjected to baking or blanket exposure before deposition (e.g., electroplating, electroless plating, physical vapor deposition, chemical vapor deposition or sputtering deposition). The thickness of the patterned photosensitive material is preferably greater than the depth or height of the three-dimensional microstructure to be formed.

A metal or alloy (e.g., nickel, cobalt, chrome, copper, zinc or an alloy derived from any of the aforementioned metals) can be electroplated and/or electroless plated onto the drum or sleeve. The plating material (26) is deposited on the outer surface of the drum or sleeve in areas that are not covered by the patterned photosensitive material. The deposit thickness is preferably less than that of the photosensitive material, as shown in FIG. 2E. The thickness variation of the deposit over the whole drum or sleeve area can be controlled to be less than 1%, by adjusting plating conditions, e.g., the distance between the anode and the cathode (i.e., drum or sleeve) if electroplating is used, the rotation speed of the drum or sleeve and/or circulation of the plating solution.

Alternatively, in the case of using electroplating to deposit the plating material (26), the thickness variation of the deposit over the entire surface of the drum or sleeve may be controlled by inserting a non-conductive thickness uniformer between a cathode (i.e., the drum or sleeve) and an anode, as described in U.S. Pat. No. 8,114,262, the content of which is incorporated herein by reference in its entirety.

After plating, the patterned photosensitive material (25) can be stripped by a stripper (e.g., an organic solvent or aqueous solution).

A precision polishing may be optionally employed to ensure acceptable thickness variation and degree of roughness of the deposit (26) over the entire drum or sleeve.

FIG. 2F shows a cross-section view of an embossing drum or sleeve with a three-dimensional pattern microstructure formed thereon.

The present inventors have found that an embossing tool may have improved release property if the surface of the embossing tool is overcoated with a precious metal or an alloy thereof.

Figure 3:
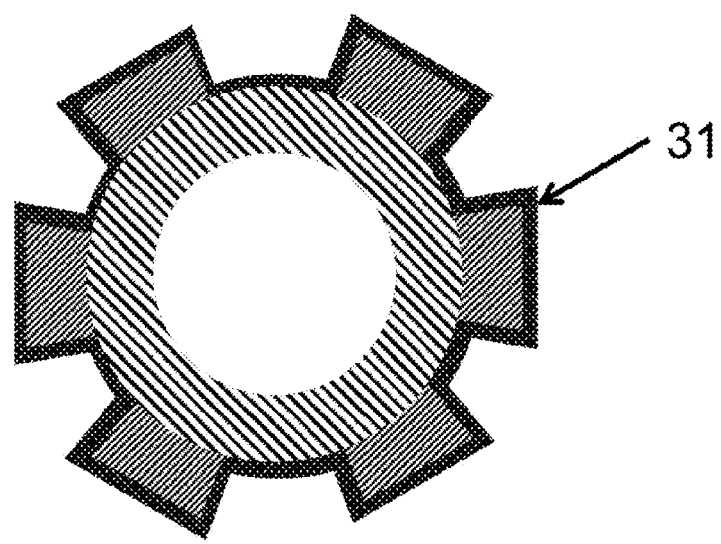
FIG. 3 is a cross-section view of an embossing tool with a three-dimensional microstructure and a precious metal (e.g., gold) plating on its surface.

In other words, as a post-treatment step after a three-dimensional microstructure is formed on the surface of an embossing tool, a precious metal or an alloy thereof (31) may be coated over the entire surface of the embossing tool, as shown in FIG. 3.

The term "precious metal", in the context of the present invention, may include, gold, silver, platinum, palladium and other less commonly known metals, such as ruthenium, rhodium, osmium or iridium.

Among the precious metals, the present inventors have found gold and its alloy to be most effective in reducing the adhesion between the cured or hot embossed material and the surface of the embossing tool. This advantage is especially clear when the cured or hot embossed material has one or more of the following components—polyacrylate, polymethyl methacrylate (PMMA), polyethyl methacrylate (PEMA), polycarbonate (PC), polyvinyl chloride (PVC), polystyrene (PS), polyester, polyamide, polyurethane, polyolefin, polyvinylbutyral and copolymers thereof. Among these cured or hot embossed materials, acrylate- or methacrylate-based polymers are particularly preferred.

An alloy of one or more precious metals and non-precious metals may also be used for the present invention. Suitable non-precious metals in an alloy may include, but are not limited to, copper, tin, cobalt, nickel, iron, indium, zinc or molybdenum. In the alloy, there may also be more than one precious metal and/or more than one non-precious metal. The total weight percentage of the non-precious metal in the alloy may be in the range of 0.001% to 50%, preferably in the range of 0.001% to 10%.

The coating of the precious metal or alloy may be accomplished by electroplating, electro-less deposition, sputtering coating or vapor deposition. In one embodiment, cyanide-based neutral gold, acid hard gold or gold strike plating electrolytes may be used at temperatures of 30-70° C. and in a pH range of 3-8. Platinum and palladium may be plated with acid chloride electrolytes at temperatures of 40-70° C. and in a pH range of 0.1-3. Some alkaline electrolytes for precious metals or alloys thereof are commercially available and may also be used for the present invention.

The precious metal or alloy thereof on the surface preferably has a thickness in sub-microns, and therefore it does not cause any significant change to the profile of the microstructure. The thickness of the precious metal or alloy thereof may be in the range of 0.001 to 10 microns, preferably in the range of 0.001 to 3 microns.

Figure 4:
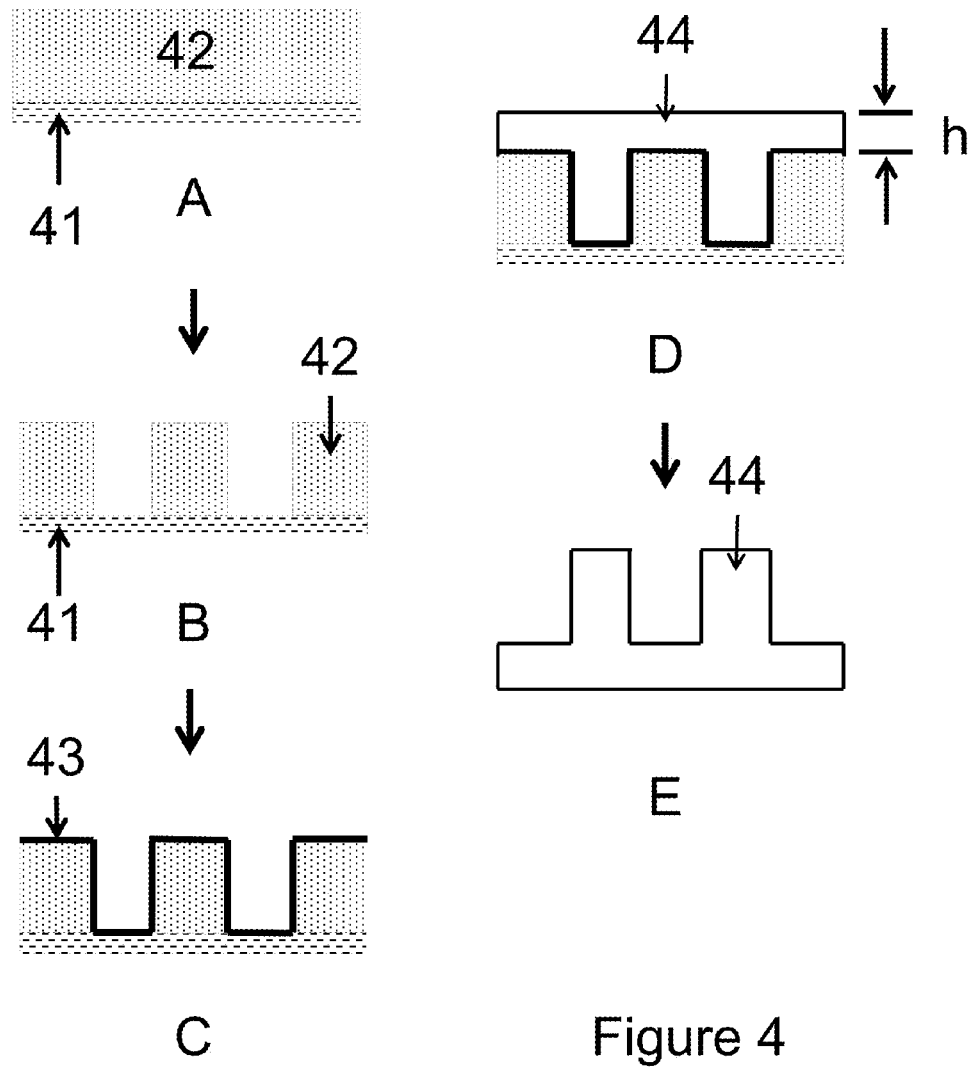
FIGS. 4 and 5 illustrate alternative methods for forming a microstructure on the surface of an embossing tool.

Method 2:

Alternatively, a three-dimensional microstructure may be formed on a flat substrate, as shown in FIG. 4.

In FIG. 4A, a photosensitive material (42) is coated on a substrate layer (41) (e.g., a glass substrate). The photosensitive material, as stated above, may be of a positive tone, negative tone or dual tone. The photosensitive material may also be a chemically amplified photoresist. The coating may be carried out using dip, spray, slot die, or spin coating. After drying and/or baking, the photosensitive material is subjected to exposure to a suitable light source (not shown) through a photomask (not shown).

Alternatively, the photosensitive material (42) can be a dry film photoresist (which is usually commercially available) that is laminated onto the substrate (41). The dry film is also exposed to a light source as described above, In the step of FIG. 4B, after exposure, depending on the tone of the photosensitive material, either the exposed or un-exposed areas of the photosensitive material will be removed by using a developer. After development, the substrate layer (41) with the remaining photosensitive material (42) may be subjected to baking or blanket exposure before the step of FIG. 4C. The thickness of the remaining photosensitive material should be the same as the depth or height of the three-dimensional microstructure to be formed.

In the step of FIG. 4C, an electrical conductive seed layer (43) is coated over the remaining photosensitive material (42) and the substrate (41) in areas not occupied by the photosensitive material. The electrical conductive seed layer is usually formed of silver.

In the step of FIG. 4D, a metal or alloy (44) (e.g., nickel, cobalt, chrome, copper, zinc, or an alloy derived from any of the aforementioned metals) is electroplated and/or electroless plated onto the surface covered by electrical conductive seed layer and the plating process is carried out until there is enough plated material thickness (h) over the patterned photosensitive material. The thickness (h) in FIG. 4D is preferably 25 to 5000 microns, and more preferably 25 to 1000 microns.

After plating, the plated material (44) is separated from the substrate layer (41) which is peeled off. The photosensitive material (42) along with the electrical conductive seed layer (43) is removed. The photosensitive material may be removed by a stripper (e.g., an organic solvent or aqueous solution). The electrical conductive seed layer (43) may be removed by an acidic solution (e.g., sulfuric/nitric mixture) or commercially available chemical strippers, leaving behind only a metal sheet (44) having a three-dimensional structure on one side and being flat on the other side.

A precision polishing may be applied to the metal sheet (44), after which the flat shim may be used directly for embossing. Alternatively, it may be mounted on (i.e., wrapped over) a drum with the three-dimensional microstructure on the outer surface to form an embossing tool.

A precious metal or alloy thereof is finally coated over the entire surface of the embossing tool, as described above. As stated above, gold or its alloy is preferred over other precious metals and alloys.

Figure 5:
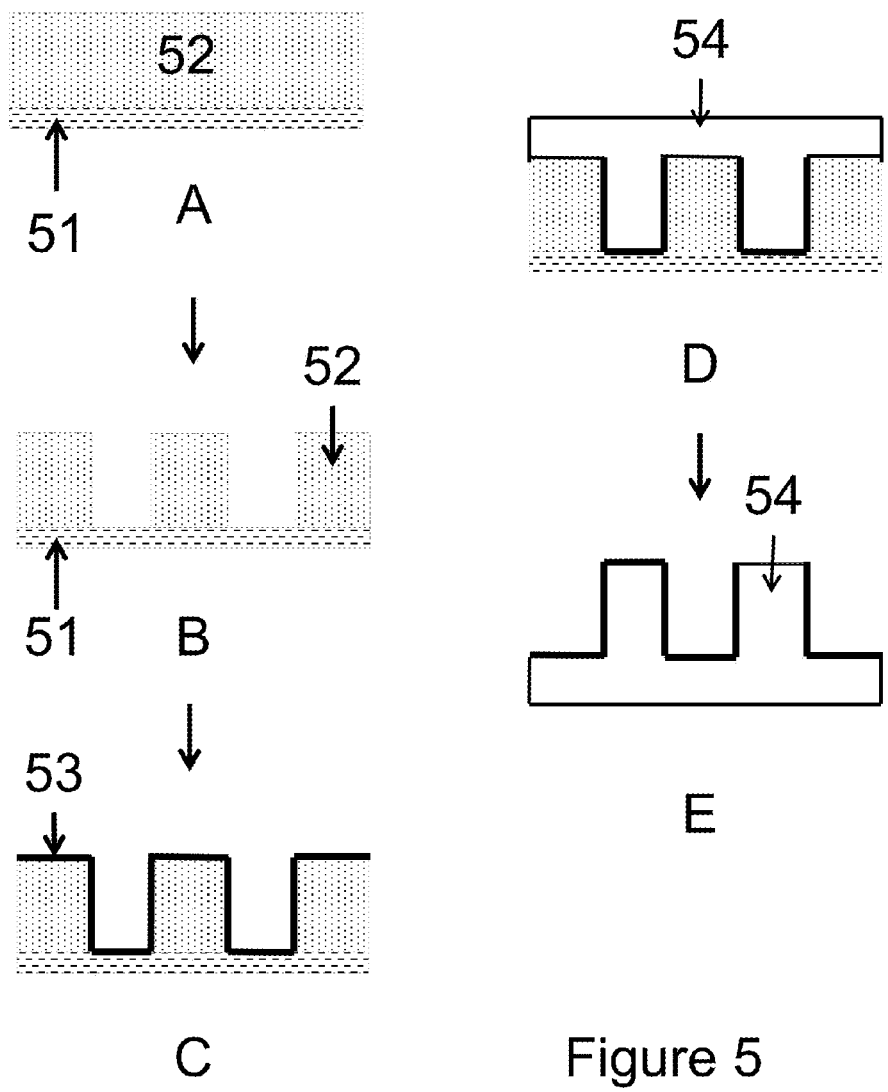

Method 3:

A further alternative method is demonstrated in FIG. 5. This method is similar to that of FIG. 4, but simplified. In the step of FIG. 5C, instead of an electrical conductive seed layer such as silver, a layer of precious metal or alloy thereof (53) is coated. As stated above, gold or its alloy is preferred.

Consequently, in the step of FIG. 5E, after the plated material (54) is separated from the substrate (51), only the photosensitive material (52) is removed, the gold or alloy coating (53) remains with the metal sheet (54) with a three-dimensional structure on one side and being flat on the other side.

The metal sheet may be used directly for embossing. Alternatively, it may be mounted over a drum. In this alternative method, there is no need to have a separate coating step to form a layer of gold or alloy over the surface of the embossing tool.

The embossing tool of the present invention is suitable for a microembossing process as described in U.S. Pat. No. 6,930,818, the content of which is incorporated herein by reference in its entirety. The microembossing process manufactures cup-like microcells separated by partition walls such as MICROCUPS®. The microcells may be filled with an electrophoretic fluid comprising charged particles dispersed in a solvent or solvent mixture. The filled microcells form an electrophoretic display film. The electrophoretic display film, when sandwiched between electrode layers, forms an electrophoretic device.

Example 1

In this example, two embossing tools (i.e., male molds) were prepared. The molds were formed of nickel, according to one of the methods as described above.

The surface of one of the nickel molds was untreated. The other nickel mold formed was further electroplated with a cyanide-based gold plating electrolyte operated at temperature of 50° C. and pH 5, to achieve a gold coating on its surface, having a thickness of 0.5 micron.

For testing of the two embossing molds, a water-based polymer layer fluid and an embossing composition were prepared. The polymer layer fluid was prepared according to U.S. Pat. No. 7,880,958, and it had polyvinyl alcohol as a major component. The embossing composition was prepared according to U.S. Pat. No. 7,470,386, and it had multifunctional acrylate as a major component.

The polymer fluid was first coated on a PET (polyethylene terephthalate) substrate using a #3 Meyer drawdown bar. The dried polymer layer had a thickness of 0.5 micron.

The embossing composition was diluted with MEK and then coated onto the polymer layer side of the PET substrate, with a targeted dry thickness of 25 microns. The coating was dried and embossed separately, with the two embossing molds, at 160° F. under a pressure of 50 psi, with UV exposure (0.068 J/cm², Fusion UV, D lamp) through the back of the PET substrate.

Figure 6A:
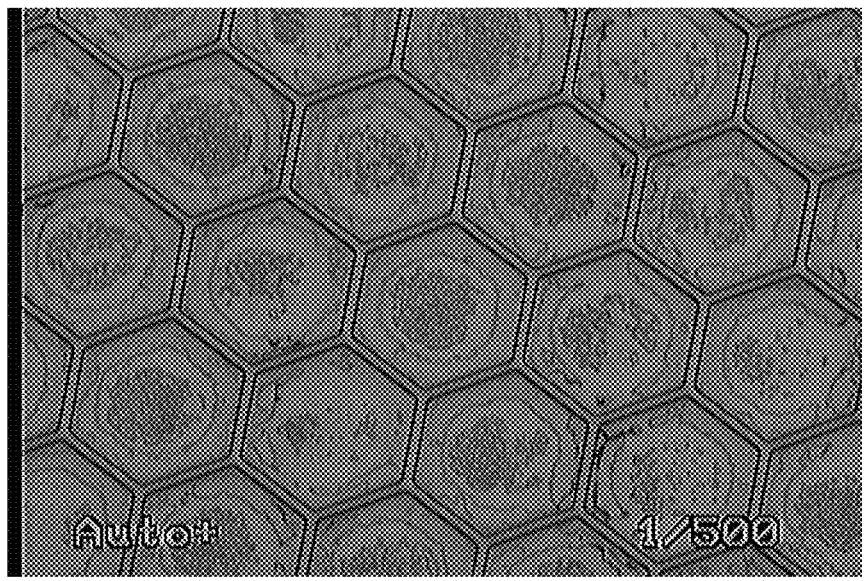
FIG. 6A is a photograph showing the surface of an object manufactured from an embossing process with a conventional embossing tool.

FIG. 6A is the microscopic photograph of the surface of a film prepared by using the nickel embossing mold. It can be seen that some of the cured materials on the resulting film had been transferred to, or stuck on, the nickel mold because of the strong adhesion between the cured material and the nickel metal, leaving an uneven surface on the resulting film.

Figure 6B:
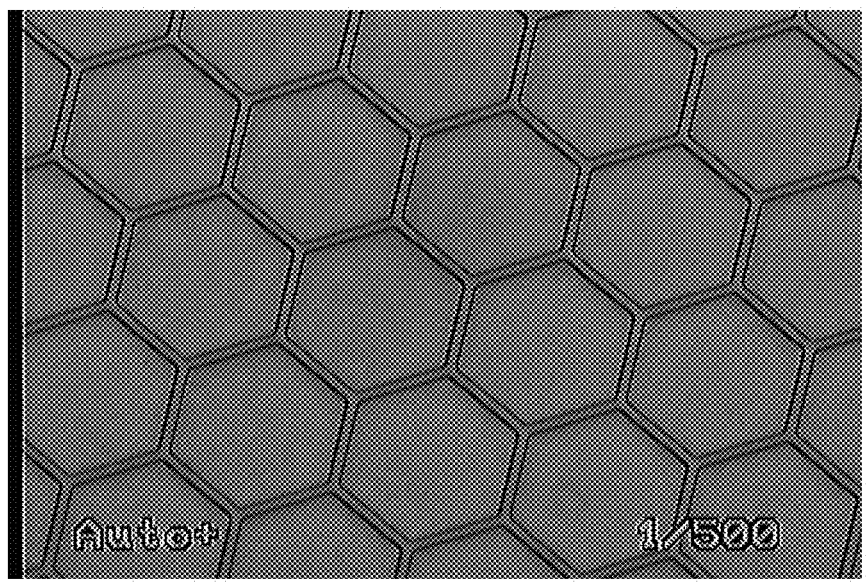
FIG. 6B is a photograph showing the surface of an object manufactured from an embossing process with an embossing tool of the present invention.

With the gold plated nickel mold, the cured embossing material was completely separated from the gold metal surface, leaving behind a smooth surface on the resulting film, as shown in FIG. 6B. This is due to the fact that the gold-plated surface had decreased the adhesion between the mold surface and the cured material, rendering the release of the mold from the cured material much easier.

Example 2

In this example, several embossing tools (i.e., male molds) were prepared. The molds were formed of nickel, according to one of the methods as described above.

One of the nickel molds formed was further electroplated with 0.5 micron of gold with the same electrolyte bath as that used in Example 1.

Three of the nickel molds formed were further silane surface treated. For silane treatment, polydimethylsiloxane (Gelest, Inc.) was added into a mixture of 95% n-propyl alcohol and 5% DI water, which was prior adjusted to pH 4.5 with acetic acid. Polydimethylsiloxane solutions of three concentrations at 0.25%, 1% and 2 wt %, respectively, were prepared. Nickel molds were separately immersed into the silane solutions of different concentrations, for 10 minutes and then baked at 100° C. overnight to achieve a silane coating on the surface of the microstructure.

The embossing testing materials and conditions were the same as those used in Example 1. With the gold plated nickel mold, all of the cured embossing material was completely separated from the gold metal surface. However, more than about 50% of the area of the cured embossing material on the resulting films had been transferred to, or stuck on, the silane-treated nickel mold surface, regardless of the polydimethylsiloxane concentrations in the treatment solution.

This example shows that the cured material was easier to be released from gold plated surface than silane treated surfaces.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method for preparing an embossing tool comprising:
   i) coating a photoresist material on a substrate;
   ii) exposing the photoresist material to a light source;
   iii) removing the exposed areas or unexposed areas of the photoresist material;
   iv) coating a layer of gold or an alloy thereof over the remaining photoresist material and on the substrate where the photoresist material has been removed;
   v) plating a non-precious metal over the layer of gold or an alloy thereof to form a non-precious metal layer; and
   vi) removing the substrate and the photoresist material to form the embossing tool with a three-dimensional structure on an external side and being flat on the other side, wherein the external side of the embossing tool is coated with the layer of gold.

2. The method of claim 1, wherein the non-precious metal comprises copper, tin, cobalt, nickel, iron, indium, zinc or molybdenum.

3. The method of claim 1, wherein the alloy comprises gold and one or more of non-precious metals selected from the group consisting of copper, tin, cobalt, nickel, iron, indium, zinc and molybdenum.

4. The method of claim 3, wherein the total weight of the non-precious metals in the alloy is in the range of 0.001% to 50%.

5. The method of claim 3, wherein the total weight of the non-precious metals in the alloy is in the range of 0.001% to 10%.

6. The method of claim 1, wherein the layer of gold or an alloy thereof has a thickness in the range of 0.001 to 10 microns.

7. The method of claim 1, wherein the layer of gold or an alloy thereof has a thickness in the range of 0.001 to 3 microns.

8. A method for preparing an embossing tool comprising:
   i) coating a photoresist material on a substrate;
   ii) exposing the photoresist material to a light source;
   iii) removing the exposed areas or unexposed areas of the photoresist material;
   iv) coating an electrical conductive seed layer over the remaining photoresist material and on the substrate where the photoresist material has been removed;
   v) plating a non-precious metal over the electrical conductive seed layer to form a non-precious metal layer;
   vi) removing the substrate and the photoresist material to form the embossing tool with a three-dimensional structure on an external side and being flat on the other side; and
   vii) coating the external side of the embossing tool with a layer of gold or an alloy thereof.

9. The method of claim 8, wherein the non-precious metal comprises copper, tin, cobalt, nickel, iron, indium, zinc or molybdenum.

10. The method of claim 8, wherein the alloy comprises gold and one or more of non-precious metals selected from the group consisting of copper, tin, cobalt, nickel, iron, indium, zinc and molybdenum.

11. The method of claim 10, wherein the total weight of the non-precious metals in the alloy is in the range of 0.001% to 50%.

12. The method of claim 10, wherein the total weight of the non-precious metals in the alloy is in the range of 0.001% to 10%.

13. The method of claim 8, wherein the layer of gold or an alloy thereof has a thickness in the range of 0.001 to 10 microns.

14. The method of claim 8, wherein the layer of gold or an alloy thereof has a thickness in the range of 0.001 to 3 microns.

* * * * *